United States Patent [19]

Heimbigner

[11] Patent Number: 4,707,808
[45] Date of Patent: Nov. 17, 1987

[54] SMALL SIZE, HIGH SPEED GAAS DATA LATCH

[75] Inventor: Gary L. Heimbigner, Anaheim, Calif.

[73] Assignee: Rockwell International Corporation, El Segundo, Calif.

[21] Appl. No.: 727,958

[22] Filed: Apr. 26, 1985

[51] Int. Cl.[4] .............................................. G11C 7/00
[52] U.S. Cl. .................................. 365/182; 365/154; 307/584
[58] Field of Search ............... 365/182, 189, 174, 154; 307/279, 291, 445, 584

[56] References Cited
U.S. PATENT DOCUMENTS 3,798,616  3/1974  Spence ................................. 365/189
3,975,718  8/1976  Goser ................................. 307/279
3,997,881  12/1976  Hoffmann ............................ 307/279

Primary Examiner—Stuart N. Hecker
Assistant Examiner—Glenn A. Gossage
Attorney, Agent, or Firm—H. Fredrick Hamann; George A. Montanye; Wilfred G. Caldwell

[57] ABSTRACT

The invention provides small size, high speed data latches comprising memory cells that are fabricated according to a Gallium Arsenide (GaAs) process. The memory cells are implemented by a relatively few number of depletion metal semiconductor field effect transistors (MESFETs), saturated resistors and diodes. A common gate MESFET is utilized in each memory cell configuration as part oif a non-inverting positive feedback path to provide the gain necessary for bistable operation.

2 Claims, 5 Drawing Figures

SMALL SIZE, HIGH SPEED GAAS DATA LATCH

The invention herein described was made in the course of or under Contract DASG-60-82-C-0051, with the Department of the Army.

FIELD OF THE INVENTION

This invention relates to small size, high speed data latches which are fabricated from a GaAs process and formed by depletion metal semiconductor field effect transistors (MESFETs), saturated resistors and diodes.

BACKGROUND OF THE INVENTION

Data latches of conventional design are commonly fabricated from a relatively large number of devices. Examples of such conventional data latches are illustrated in FIGS. 1 and 2 of the drawings. The conventional latch of FIG. 1 comprises the interconnection of inverter, NAND and OR gates. Such an arrangement is typically implemented by fifteen transistors and six diodes. The conventional latch of FIG. 2 comprises the interconnection of inverter, AND, and NOR gates. Such an arrangement is typically implemented by sixteen transistors and six diodes.

As will be apparent, data latches which are fabricated from a relatively large number of devices are frequently characterized by large size, slow speed, high power consumption and high cost. What is more, such data latches are often associated with relatively complex write and read circuitry. Therefore, the conventional latches of FIGS. 1 and 2 are particularly unsuitable in large data arrays, whenever size, speed, power consumption and cost are important considerations.

SUMMARY OF THE INVENTION

Briefly, and in general terms, data latches are disclosed which are characterized by small size, high speed and low power consumption. The data latches comprise memory cells which are fabricated according to a known Gallium Arsenide (GaAs) process. Each of the memory cells is fabricated by a relatively few (e.g. from three to six) depletion metal semiconductor field effect transistors (MESFETs), saturated resistors and diodes. The saturated resistors, which operate in the memory cells as voltage pull up and pull down devices, may be replaced by MESFETs, depending upon value and physical size requirements. In order to preserve the logical state of information which is written into each memory cell at a respective data storage node thereof, a common gate MESFET is interconnected with such data node. The common gate MESFET (the gate electrode of which is connected to receive a fixed reference voltage signal) forms a non-inverting positive feedback path to provide the gain necessary for bistable memory cell operation.

The disclosed memory cells are particularly useful for several applications. In one configuration, the memory cell may be used in small registers, such as microprocessors and holding registers. In another configuration, the memory cell may be used to drive either a logic gate or a succeeding memory cell stage which is interconnected therewith to form a flip-flop. Of course, each memory cell configuration is especially suitable to a memory array which is to be fabricated according to a GaAs process.

DESCRIPTION OF THE PREFERRED EMBODIMENTS

Figure 1:
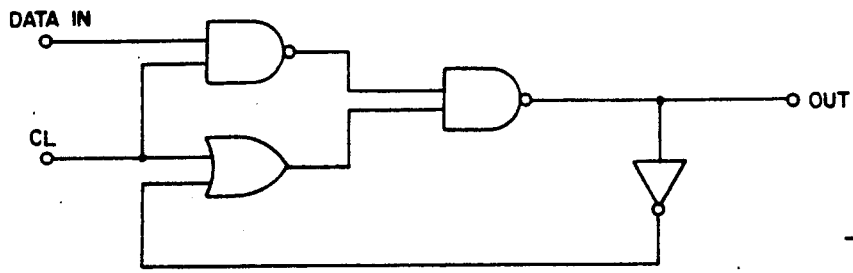
FIGS. 1 and 2 of the drawings represent prior art data latches.
Figure 2:
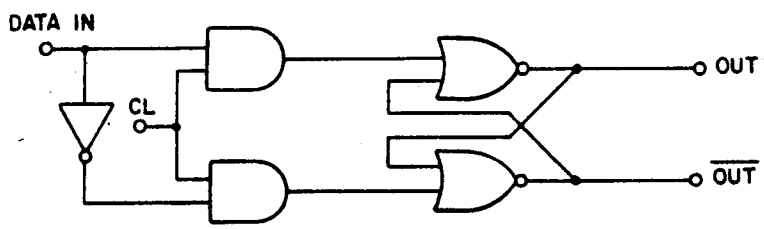
Figure 3:
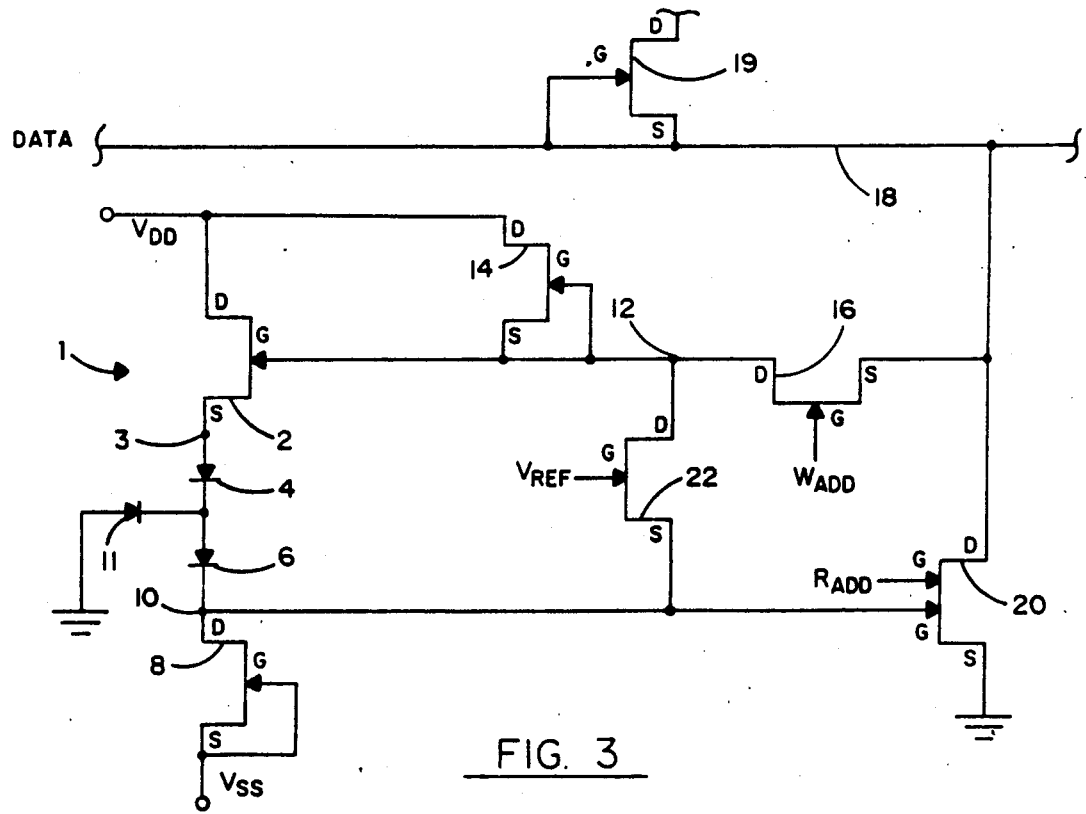
FIGS. 3 and 5 illustrate memory cell configurations which form GaAs data latches of the present invention.

Referring now to FIG. 3 of the drawings, a GaAs data latch is shown which is a small, fast and low power memory cell 1 that is particularly useful in small register applications. The memory cell 1 is fabricated according to a known Gallium Arsenide (GaAs) process and includes a plurality of depletion metal semiconductor field effect transistors (MESFETs). A process which is suitable for manufacturing the GaAs memory cell 1 of FIG. 3 is described in *IEEE TRANSACTIONS ON ELECTRON DEVICES*, Vol. ED 27, No. 6, June, 1980, pp 1116-1124. In general terms, a MESFET device is a three terminal transistor wherein the gate electrode lays directly upon the channel (i.e. there is no oxide layer disposed between the gate and channel, as is otherwise common to a conventional metal oxide semiconductor field effect transistor). The MESFETs used in the following embodiments are characterized by a pinch off voltage of approximately $-1.0$ volts.

The memory cell 1 of FIG. 3 is implemented as follows. During the following description, it is to be understood that all references to a FET actually refer to a MESFET. A FET 2 is connected in a series circuit with a pair of diodes 4 and 6 and a voltage pull-down FET 8. Such series circuit is connected between a pair of different sources of reference potential, designated $V_{DD}$ and $V_{SS}$. More particularly, the drain electrode of FET 2 is connected to reference source $V_{DD}$ (typically $+2.5$ volts) and the source electrode is connected at a common electrical junction 3 with the anode of diode 4. The gate electrode of FET 2 is connected to a common electrical junction (i.e. a data storage node) 12, such that FET 2 is connected to operate as a source follower. The cathode of diode 4 is connected to the anode of diode 6. The cathode of diode 6 is connected to a common electrical junction 10 with the drain electrode of voltage pull-down FET 8. The source and gate electrodes of pull-down FET 8 are connected together at reference source $V_{SS}$ (typically $-2.0$ volts). A clamping diode 11 is connected to memory cell 1, such that the cathode thereof is connected between diodes 4 and 6 and the anode is connected to ground.

Figure 4:
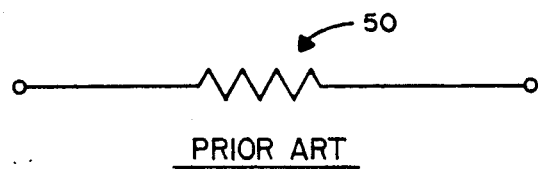
FIG. 4 represents a saturated resistor which may be substituted for a MESFET device in the memory cells of FIGS. 3 and 5.

In general terms, a saturated resistor is fabricated like a conventional transistor, except that the gate electrode has been omitted. For a more detailed description of a saturated resistor, reference may be made to *IEEE TRANSACTIONS ON MICROWAVE THEORY AND TECHNIQUES*, Vol. MTT 30, No. 7, July, 1982, pp 1007-1013. Referring briefly to FIG. 4 of the drawings, a saturated resistor 50 may be implemented as a MESFET which has the source electrode there of connected directly to the gate electrode. Accordingly, it is to be understood that the saturated resistor 50 of FIG. 4 may be substituted for the MESFETs (e.g. 8, 14 and 19) to which reference will be made during the description of the memory cell 1 of FIG. 3.

Referring once again to FIG. 3, the drain electrode of a voltage pull-up FET 14 is connected to the reference source $V_{DD}$, and the source and gate electrodes thereof are connected together at data node 12. An access FET 16 is connected between the data node 12 and a data bus line 18, designated DATA. That is, the drain electrode of FET 16 is connected to data node 12, and the source electrode thereof is connected bus line 18. The gate electrode of FET 16 is connected to receive a write address signal, designated $W_{ADD}$. Thus, depending upon the level of the signal at the gate electrode of access FET 16, the memory cell 1 can be selectively addressed to permit access to data node 12 (via the conduction path of FET 16) during the writing of information therein. The source and gate electrodes of a voltage pull-up FET 19 are connected together at bus line 18, and the drain electrode thereof is connected to a source of reference potential (not shown).

An output FET 20 is connected between bus line 18 and ground. That is, the drain electrode of FET 20 is connected to bus line 18, and the source electrode thereof is connected to ground. FET 20 has a pair of gate electrodes. One gate electrode is connected to the common electrical junction 10. The other gate electrode of FET 20 is connected to receive a read address signal, designated $R_{ADD}$. As will be hereinafter explained, depending upon the level of the signals at the gate electrodes of output FET 20, the content of the information stored at data node 12 may be read via the bus line 18.

As an important aspect of the memory cell configuration of FIG. 3, a common gate FET 22 is connected between the data node 12 and the common electrical junction 10. That is, the drain electrode of FET 22 is connected to data node 12 and the source electrode thereof is connected to common electrical junction 10. The gate electrode of FET 22 is connected to a source of constant reference voltage designated $V_{REF}$ (e.g. $-0.8$ volts). Thus, the common gate FET 22 is connected to receive a fixed level input signal (at the gate electrode thereof) throughout the operation of memory cell 1. As will soon be described, the common gate connection of FET 22 preserves the level of the information signal stored at data node 12.

In operation, the two stable memory states of the memory cell 1 of FIG. 3 are now described for writing information and storing such information at data node 12. During a first case, a signal representative of a logic level 1 (e.g. $+2.5$ volts) is applied to bus line 18 by means of conventional write driver (not shown) such as a suitable push-pull pair of transistor devices, or the like. Memory cell 1 is addressed by supplying a write address signal $W_{ADD}$ (e.g. $+0.5$ volts) to the gate electrode of access FET 16, whereby FET 16 is rendered conductive. The voltage applied to data node 12 via the conduction path of access FET 16 is pulled up to approximately $+2.5$ volts (corresponding to a logic level 1) by the pull-up FET 14. FET 2, the gate electrode of which receives $+2.5$ volts from data node 12, operates in a source follower mode, such that common electrical junction 3 is driven to approximately $+2.0$ volts. The voltage at common electrical junction 10 drops to approximately $+0.5$ volts, which reflects the voltage drop and level shift across both of diodes 4 and 6.

The reference voltage signal, designated $V_{REF}$, applied to the gate electrode of common gate FET 22 is selected to be low enough so as not to forward bias the source-gate diode junction of FET 22 and high enough to be capable of rendering FET 22 conductive. Therefore, and by way of example, the $V_{REF}$ signal is maintained at $-0.8$ volts. With the source electrode of FET 22 receiving $+0.5$ volts (from common electrical junction 10) and the gate electrode thereof receiving $-0.8$ volts (from $V_{REF}$), FET 22 is rendered non-conductive.

After memory cell 1 has been addressed and data node 12 driven to a logic level 1, write address signal $W_{ADD}$ (e.g. $-1.2$ volts) is supplied to the gate electrode of access FET 16, whereby FET 16 is rendered non-conductive and the information content of data node 12 is preserved (i.e. held relatively high). The clamping diode 11 acts to reduce the sensitivity of the signal stored at data node 12 to any ratioing between devices 14 and 22.

During a second case, a signal representative of a logic level 0 (e.g. $+0.2$ volts) is applied to bus line 18 by means of the aforementioned write driver. The memory cell 1 is again addressed by supplying a suitable write address signal $W_{ADD}$ ($+0.5$ volts) to the gate electrode of access FET 16, whereby to render FET 16 conductive. The voltage applied to data node 12 via the conduction path of access FET 16 is pulled up to approximately $+0.3$ volts (corresponding to a logic level 0) by pull-up FET 14. FET 2, the gate electrode of which receives $+0.3$ volts from data node 12, operates in a source follower mode, such that common electrical junction 3 is driven to approximately 0 volts. The voltage at common electrical junction 10 drops to approximately $-1.2$ volts, which reflects the voltage drop across both diodes 4 and 6. With the source electrode of common gate FET 22 receiving $-1.2$ volts (from common electrical junction 10) and the gate electrode receiving $-0.8$ volts (from $V_{REF}$), FET 22 is rendered conductive and turned on hard.

After memory cell 1 has been addressed and data node 12 driven to a logic level 0, a write address signal $W_{ADD}$ of $-1.2$ volts is supplied to the gate electrode of access FET 16, whereby to render FET 16 non-conductive. With access FET 16 rendered non-conductive and common gate FET 22 rendered conductive, the information content of data node 12 is preserved (i.e. held relatively low).

Thus, the information content of data node 12 is set while the write address signal, $W_{ADD}$, is relatively high (i.e. $+0.3$ volts) and the bus line 18 is forced to either a logical 1 or 0. However, when the address signal $W_{ADD}$ is relatively low (i.e. $-1.2$ volts), the access FET 16 is rendered non-conductive, and the logical state of the bus line 18 has no effect upon the memory cell 1.

To read out the data that is stored at data node 12 of memory cell 1, a relatively high read address signal $R_{ADD}$ (e.g. $+0.3$ volts) is applied to one of the pair of gate electrodes of output FET 20. Accordingly, if common electrical junction 10 (and, therefore, the other gate electrode of FET 20) also receives a relatively high signal (e.g. $+0.5$ volts), output FET 20 is rendered conductive. Thus, bus line 18 is driven to ground by way of the conduction path of FET 20. However, if common electrical junction 10 receives a relatively low signal (e.g. $-1.2$ volts) while the read address signal $R_{ADD}$ is relatively high, FET 20 is rendered non-conductive, and pull-up FET 19 holds the bus line 18 at a relatively high signal level. Therefore, it will be recognized that the output of memory cell 1 to bus line 18 is the inverse of the logical state of the information stored at data node 12.

The output of memory cell 1 can also be used to drive other logic devices after appropriate level shifting has been accomplished, in a well known fashion. As will be appreciated from the foregoing, the memory cell 1 requires relatively simple read and write circuitry. The cell 1 is also particularly useful in small registers, such as, for example, a micro-processor or a holding register, wherein to provide a high speed, low power data latch that is formed from a relatively few number of components (i.e. 6 MESFETs and 3 diodes).

Figure 5:
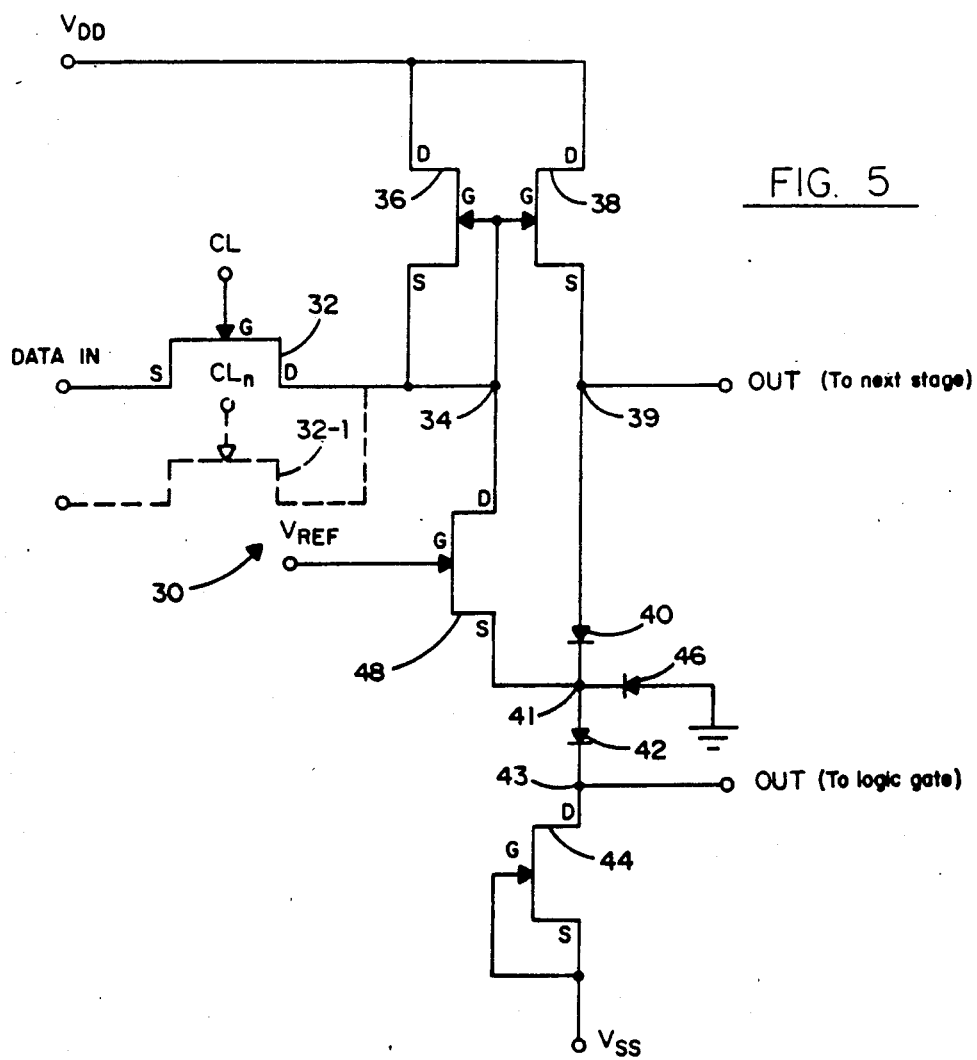

Referring now to FIG. 5 of the drawings, another GaAs data latch is shown which is a small, very fast and low power memory cell 30 that is particularly applicable for driving a logic gate or a succeeding one of such memory cells. Like the memory cell 1 of FIG. 3, memory cell 30 is fabricated according to a Gallium Arsenide process. Also like the memory cell 1, memory cell 30 is fabricated from a plurality of depletion metal semiconductor field effect transistors (MESFETs). Accordingly, during the following description of memory cell 30, it is to be understood that all references to a FET actually refer to a MESFET.

An input FET 32 has a conduction path connected between a data input terminal and a common electrical junction (i.e. data storage node) 34. That is, the source electrode of FET 32 is connected to the data input terminal and the drain electrode is connected to data node 34. The gate electrode of FET 32 is connected to receive a clock (or other input control) signal, designated CL. Although a single input FET 32 is shown and described, it is to be understood that one or more additional input FETs (e.g. 32-1, shown in phantom) may also be interconnected in a like manner to that of input FET 32.

A voltage pull-up FET 36 is connected between a source of reference potential, designated $V_{DD}$ (e.g. +2.5 volts) and data node 34. That is, the drain electrode of pull-up FET 36 is connected to the reference source $V_{DD}$, and the source and gate electrodes thereof are connected together at data node 34. As earlier described (when referring to FIG. 4), a saturated resistor may be substituted for pull-up FET 36.

A FET 38 is connected in a series circuit with a pair of diodes 40 and 42 and a voltage pull-down FET 44. Such series circuit is connected between sources reference potential $V_{DD}$ and $V_{SS}$. More particularly, the drain electrode of FET 38 is connected to the reference source $V_{DD}$, and the source electrode thereof is connected at a common electrical junction 39 is the anode of diode 40. The gate electrode of FET 38 is connected to data node 34, whereby FET 38 is connected to operate as a source follower. The cathode of diode 40 is connected at a common electrical junction 41 with the anode of diode 42. The cathode of diode 42 is connected at a common electrical junction 43 with the drain electrode of pull-down FET 44. A clamping diode 46 is connected to memory cell 30, such that the cathode thereof is connected to common electrical junction 41 and the anode is connected to ground. The source and gate electrodes of FET 4 are connected together at the reference source $V_{SS}$ (e.g. −2.0 volts). A previously described saturated resistor may be substituted for pull-down FET 44.

As an important aspect of the memory cell configuration of FIG. 5, a common gate FET 48 is connected between the data node 34 and the common electrical junction 41. That is, the drain electrode of FET 48 is connected to data node 34 and source electrode thereof is connected to common electrical junction 41. The gate electrode of FET 48 is connected to a source of constant reference voltage, designated $V_{REF}$ (e.g. −0.8 volts). The common gate FET 48 is connected to receive a fixed level input signal at the gate electrode thereof throughout the operation of memory cell 30. The common gate connection of FET 48 acts to preserve the level of the information signal stored at data node 34.

In operation, the two stable memory states of the memory cell 30 of FIG. 5 are now described for writing information and storing such information at data node 34. During a first case, a signal representative of a logical 1 (e.g. +2.5 volts) is applied to the data input terminal of input FET 32. During the time when a control signal (e.g. +0.5 volts) is applied to the gate electrode FET 32, FET 32 is rendered conductive. Data node 34 is driven to approximately +1.5 volts via the conduction path of FET 32, whereupon FET 32 is rendered non-conductive. The voltage applied to data node 34 is pulled up to approximately +2.5 volts (corresponding to a logic level 1) by pull-up FET 36. FET 38, the gate electrode of which receives +2.5 volts from data node 34, is rendered conductive, such that common electrical junction 39 is driven to approximately +2.0 volts via the conduction path of FET 38. Common electrical junctions 41 and 43 receive approximately +1.2 volts and +0.4 volts, respectively, as a result of successive drops in voltage across diodes 40 and 42. The source electrode of common gate FET 48 receives +1.2 volts (from common electrical junction 41), and the gate electrode thereof receives −0.8 volts (from $V_{REF}$), whereby FET 48 is rendered non-conductive. Accordingly, the information content of data node 34 is preserved (i.e. held relatively high at +2.5 volts).

During a second case, a signal representative of a logical 0 (e.g. +0.3 volts) is applied to the data input terminal of input FET 32. During the time when the +0.5 volt control signal is applied to the gate electrode of FET 32, data node 34 is driven to approximately +0.3 volts (corresponding to a logical 0) via the conduction path of FET 32. FET 38, the gate electrode of which now receives +0.3 volts from data node 34, operates in a source follower made, such that common electrical junction 39 is driven to approximately 0 volts. Common electrical junction 41 receives −0.7 volts and common electrical junction 43 is pulled down to approximately −1.4 volts. The source electrode of common gate FET 48 receives −0.7 volts (from common electrical junction 41), and the gate electrode thereof receives −0.8 volts (from $V_{REF}$), whereby FET 48 is rendered conductive. After the control signal is removed from the gate electrode of FET 32, such that FET 32 is rendered non-conductive, the information content of data node 34 is preserved (i.e. held relatively low at +0.3 volts).

A pair of memory cell stages 30 of FIG. 5 may be interconnected in tandem (from the common electrical junction 39 of a first stage to the input FET of the succeeding stage) to form a D-type flip-flop. Moreover, the output signal at common electrical junction 43 (which typically ranges from +0.4 volts to −1.4 volts) can be used to drive a GaAs logic gate, such as a NAND, NOR, or inverter stage. What is still more, because of the very small time delays between the data input terminal of input FET 32 and the output terminal at common electrical junction 39, the memory cell 30 is particularly useful as a very fast data latch that is formed from a relatively few number of devices (i.e. 5 MESFETs and 3 diodes). As will also be recognized by those skilled in the art, the memory cell configuration of FIG. 5 also has application for performing a non-inverting carry in the carry path of a binary adder.

In each of the memory cell configurations 1 and 30 of FIGS. 3 and 5, a common gate MESFET 22 and 48 (having the gate electrode thereof connected to receive a fixed reference voltage signal) is used to preserve the logical state of the signal at a data storage node. Such a common gate device is particularly advantageous in the preferred memory cell embodiments by forming a non-inverting positive feedback loop with FETs 2 or 38 to provide the gain necessary for bistable operation.

It will be apparent that while a preferred embodiment of the invention has been shown and described, various modifications and changes may be made without departing from the true spirit and scope of the invention.

Having thus set forth the preferred embodiments of present invention, what is claimed is:

1. A GaAs data latch memory cell having a data node at which binary information is stored, said memory cell comprising:
   a source of binary information input signal;
   a first multi-terminal depletion MESFET device having source and drain conduction path terminals connected to apply a binary information input signal from said source of binary information input signals to said data node, said first multi-terminal device having a control terminal connected to receive an address signal by which to selectively control the conductivity of said first device,
   a source for a first voltage signal,
   a second multi-terminal depletion MESFET device of the common gate type having source and drain conduction path terminals connected to apply said first voltage signal to said data node for preserving the level of the binary state of the information signal stored at said data node for static operation, said second multi-terminal device having a control terminal connected to receive a fixed reference voltage control signal, and
   a third multi-terminal depletion MESFET device having source and drain conduction path terminals connected to supply said first voltage signal to said second multi-terminal device, said third multi-terminal device having a control terminal connected to said data node by which to control the conductivity of said third device, said third device being connected as a source follower,
   said second and third devices being interconnected to establish a non-inverting positive feedback path for providing voltage gain to the information signal stored at said data node for bistable operation.

2. The data latch memory cell recited in claim 1, further including a fourth depletion MESFET multi-terminal device coupled to said data node to provide an indication of the binary state of the information signal stored at said data node, said fourth multi-terminal device having a control terminal connected to receive the first voltage signal supplied by said third multi-terminal device by which to control the conductivity of said fourth device.

* * * * *